(12) United States Patent
Myers et al.

(10) Patent No.: US 6,486,733 B2
(45) Date of Patent: Nov. 26, 2002

(54) METHOD AND APPARATUS FOR HIGH EFFICIENCY POWER AMPLIFICATION

(75) Inventors: Ronald Gene Myers, Scottsdale, AZ (US); Bernard Eugene Sigmon, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/749,104

(22) Filed: Dec. 27, 2000

(65) Prior Publication Data

US 2002/0079960 A1 Jun. 27, 2002

(51) Int. Cl.$^7$ ................................................ H03F 3/38
(52) U.S. Cl. ..................... 330/10; 330/127; 330/136; 330/207 A; 330/251; 330/297
(58) Field of Search ..................... 330/10, 127, 136, 330/207 A, 251, 297

(56) References Cited

U.S. PATENT DOCUMENTS

| | | | | |
|---|---|---|---|---|
| 3,622,899 A | * | 11/1971 | Eisenberg | 330/22 |
| 4,831,334 A | * | 5/1989 | Hudspeth | 330/10 |
| 5,115,203 A | * | 5/1992 | Krett et al. | 330/251 |
| 5,990,735 A | | 11/1999 | Sigmon et al. | 330/10 |
| 6,072,361 A | | 6/2000 | Myers et al. | 330/10 |
| 6,084,468 A | | 7/2000 | Sigmon et al. | 330/136 |
| 6,256,482 B1 | * | 7/2001 | Raab | 455/108 |
| 6,323,731 B1 | * | 11/2001 | McCune, Jr. | 330/251 |

FOREIGN PATENT DOCUMENTS

JP  4207803  *  7/1992

OTHER PUBLICATIONS

An article entitled "A Linear Transponder For Amateur Radio Satellites" by Dr. K. Meinzer, DJ 4ZC from VHG Communications, vol. 7, Jan. 1975.
An article entitled "High–Efficiency Single–Sideband HF/VHF Transmitter Based Upon Envelope Elimination and Restoration" by F.H. Raab and D.J. Rupp, Green Mountain Radio Research Company, USA from IEEE CP392, UK pp. 12–25, Jul. 4–7, 1994.
An article entitled "Class–S High–Efficiency Amplitude Modulator" by Dr. Frederick H. Raab and D.J. Rupp, Green Mountain Radio Research from GMRR TP93–1:RF Design, vol. 17, No. 5. pp. 70–74, May 1994.
An article entitled Single–Sideband Transmission By Envelope Elimination and Restoration by Leonard R. Kahn from Proceedings of the IRE, Jul. 1952.
An article "Intermodulation Distortion in Kahn–Technique Transmitters" by Frederick H. Raab, IEEE Transactions On Microwave Theory and Techniques, vol. 44, No. 12 (Dec. 1996).

* cited by examiner

*Primary Examiner*—Michael B. Shingleton
(74) *Attorney, Agent, or Firm*—Ingrassia Fisher & Lorenz, P.C.

(57) ABSTRACT

A method and apparatus for efficient power amplification of a wideband signal with a correspondingly wide modulation bandwidth includes splitting means (110), class-G amplifier/modulator (120), and power amplifier (130). Three-level class-G amplifier/modulator (200, FIG. 2) comprises operational amplifier circuits (215, 225), three-state selection circuit (209), switch driver circuit (219), drive signal routing circuit (216), power stage circuit (217), and filter network (218). Multiple power stages are multiplexed based on the amplitude of the envelope signal.

15 Claims, 4 Drawing Sheets

METHOD AND APPARATUS FOR HIGH EFFICIENCY POWER AMPLIFICATION

FIELD OF THE INVENTION

This invention relates in general to power amplifiers and, in particular, to high efficiency, wideband power amplifiers.

BACKGROUND OF THE INVENTION

RF power efficiency and wide bandwidth are major problems in many communication systems. RF power efficiency and wide bandwidth are especially important in hand-held devices. Various apparatus are available for amplifying signals. In amplifier applications that involve the amplification and transmission of modulated signals, a premium is placed on amplifier efficiency. In addition, because many applications require a wide bandwidth, a premium is placed on the ability to efficiently create a high fidelity reproduction of a wideband signal.

Hand-held communications devices, which are more and more often required to transmit wideband signals, are an example of an application where these qualities are in demand. Low distortion allows these hand-held communications devices to communicate more reliably, and high efficiency allows the devices to operate longer on a single battery.

Wideband communications signals usually have correspondingly wide modulation bandwidths. That is, when a signal occupies a large RF bandwidth, the envelope of the signal within that bandwidth is rapidly changing. An amplifier that efficiently amplifies a signal of this type preferably has a wide RF bandwidth and a wide modulation bandwidth.

One method of achieving increased efficiency is to use envelope elimination and restoration (EER)-type amplifiers. EER is a technique through which highly efficient but nonlinear radio frequency (RF) power amplifiers can be combined with other, highly efficient amplifiers to produce a high efficiency linear amplifier system. The signal to be amplified is split into two paths: an amplitude path, and a phase path. The detected envelope is amplified efficiently in the amplitude path by a class S or other highly efficient power amplifier that operates on the bandwidth of the RF envelope rather than the RF bandwidth. The phase-modulated carrier in the phase path is then amplitude modulated by the amplified envelope signal, creating an amplified replica of the input signal.

In EER-type amplifiers the envelope signal occupying the modulation bandwidth is amplified in the amplitude path. Conventional EER-type amplifiers utilize class S modulators to amplify the modulation bandwidth included in the envelope of the input signal. Unfortunately, class S modulators are limited in bandwidth by the switching frequency at which they operate, and as the switching frequency increases, the class S modulator becomes less efficient. This practical constraint sets a maximum modulation bandwidth achievable for any given amplifier efficiency.

Accordingly, a need exists for a power amplifier that efficiently amplifies a wide band RF signal exhibiting a wide modulation bandwidth.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE DRAWINGS

Generally, the present invention helps solve the above-identified problems by providing an amplifier that efficiently amplifies wideband signals with correspondingly wide modulation bandwidths.

Figure 1:
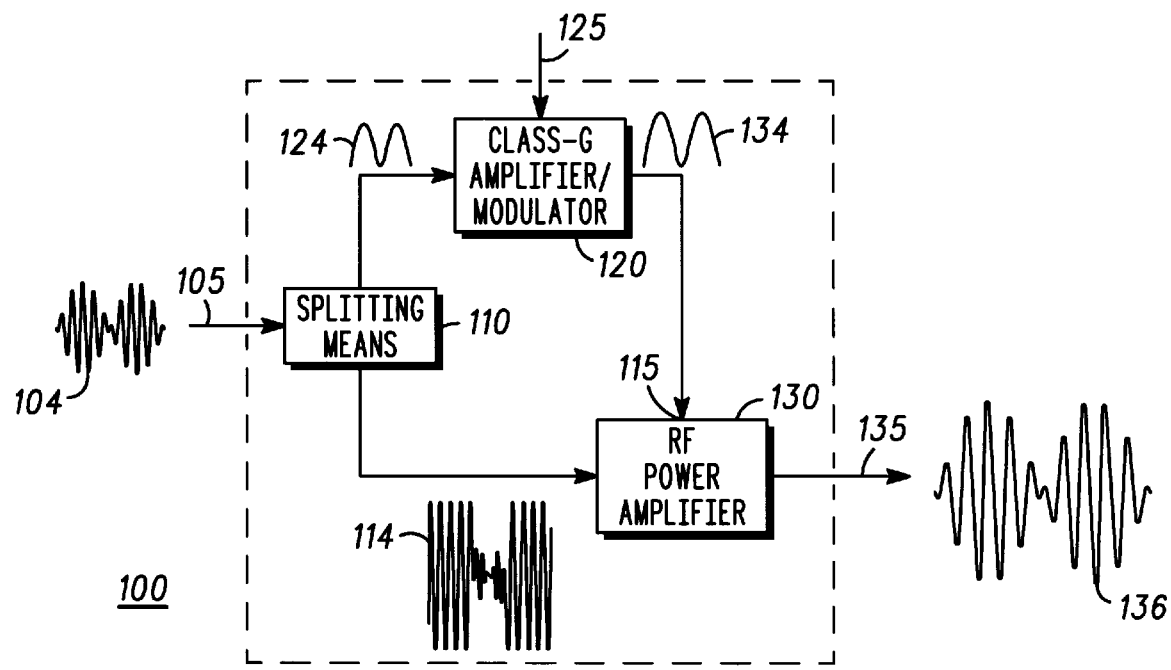
FIG. 1 shows a diagram of an EER-type amplifier in accordance with a preferred embodiment of the present invention.

FIG. 1 shows a diagram of an EER-type amplifier in accordance with a preferred embodiment of the present invention. In a preferred embodiment, EER-type amplifier 100 includes splitting means 110, class-G amplifier/modulator 120, and RF power amplifier 130. In addition, EER-type amplifier 100 comprises RF input 105, supply input 125 and RF output 135. RF input 105 is coupled to an input of splitting means 110. Supply input 125 is coupled to class-G amplifier/modulator 120. Those skilled in the art will recognize that supply input 125 can comprise one or more paths providing one or more different signals.

Splitting means 110 splits the RF input signal into envelope component 124, which feeds class-G amplifier/modulator 120, and phase component 114, which feeds RF power amplifier 130. Desirably, splitting means establishes an amplitude path and a phase path.

In a preferred embodiment, splitting means 110 comprises a limiter that amplitude limits the signal. In alternate embodiments, the limiter can be omitted, or the limiter can perform soft limiting. Desirably, the limiter performs hard limiting so that the output of the limiter includes phase information with little or no amplitude information. After limiting, with the amplitude information removed, the resultant signal is a phase-modulated carrier. In other embodiments, power amplifier 130 can comprise a limiter.

Desirably, phase component 114 is a phase-modulated carrier signal that drives power amplifier 130. Power amplifier 130 is an amplifier stage that is capable of being modulated. Desirably power amplifier 130 comprises at least one field effect transistor (FET) amplifier. At least one power supply input 115 for power amplifier 130 is provided by class-G amplifier/modulator 120 as shown in FIG. 1.

In a preferred embodiment, splitting means 110 comprises a detector that detects the envelope of the RF input signal 104, and splitting means 110 outputs an envelope signal 124 which represents the amplitude information included in the original RF input signal. In an alternate embodiment, class-G amplifier/modulator 120 can comprise a detector.

In a preferred embodiment, class-G amplifier/modulator 120 creates an envelope restoration signal 134 by amplifying envelope signal 124 to a level commensurate with the desired output. Class-G amplifier/modulator 120 drives at least one power supply input 115 of RF power amplifier 130. The resultant remodulation of the phase-modulated carrier restores the envelope, producing RF output signal 136, which is an amplified replica of RF input signal 104.

Desirably, EER-type amplifier 100 varies the bias of power amplifier 130 in such a way as to maintain operation near saturation and therefore in a region of high efficiency. Because the highly efficient power amplifier 130 consumes the majority of the power consumed in EER-type amplifier 100, the entire circuit is considerably more efficient than conventional amplifiers.

Figure 2:
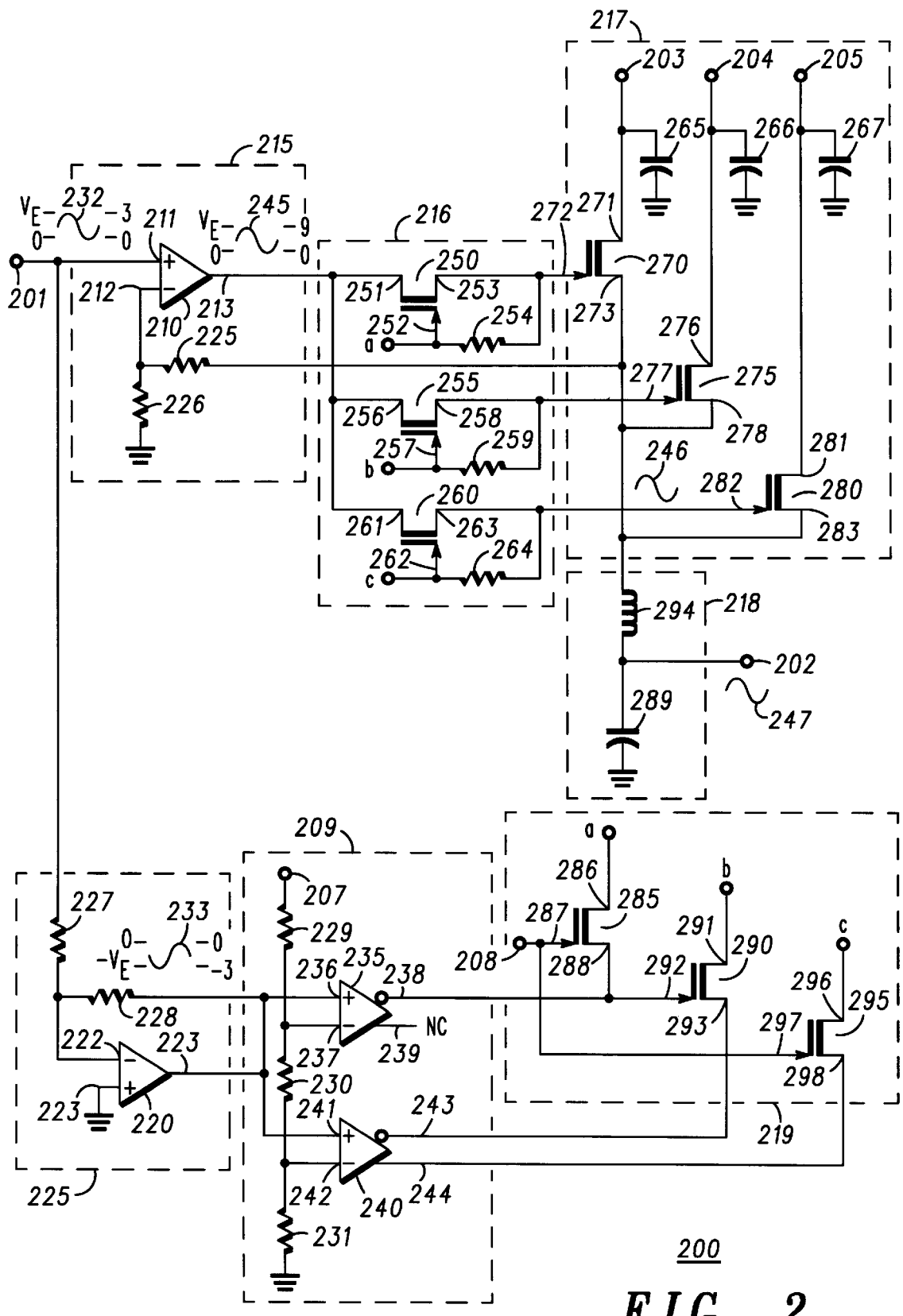
FIG. 2 illustrates a simplified schematic for a 3-level class-G amplifier/modulator in accordance with a preferred embodiment of the present invention.

FIG. 2 illustrates a simplified schematic for a three-level class-G amplifier/modulator in accordance with a preferred embodiment of the present invention. Three-level class-G amplifier/modulator 200 comprises operational amplifier circuits (215, 225), three-state selection circuit 209, switch driver circuit 219, drive signal routing circuit 216, power stage circuit 217, and filter network 218.

Input 201 is coupled to first input 211 of operational amplifier 210 and to a first node of resistor 227. Second input 212 of operational amplifier 210 is coupled to a first node of resistor 225 and first node of resistor 226. Second node of resistor 226 is coupled to ground. Those skilled in the art will understand how to properly bias operational amplifier 210.

In a preferred embodiment, output 213 of operational amplifier 210 is coupled to node 251 of transistor 250, coupled to node 256 of transistor 255, and coupled to node 261 of transistor 260.

Node 253 of transistor 250 is coupled to a first node of resistor 254 and to node 272 of transistor 270. Node 258 of transistor 255 is coupled a first node of resistor 259 and to node 277 of transistor 275. Node 263 of transistor 260 is coupled to a first node of resistor 264 and to node 282 of transistor 280.

Node 252 of transistor 250 is coupled to node 286 of transistor 285 and to a second node of resistor 254. Node 257 of transistor 255 is coupled to node 291 of transistor 290 and to a second node of resistor 259. Node 262 of transistor 260 is coupled to node 296 of transistor 295 and to a second node of resistor 264.

Node 271 of transistor 270 is coupled to first supply node 203 and to a first node of decoupling capacitor 265. Node 276 of transistor 275 is coupled to second supply node 204 and to a first node of decoupling capacitor 266. Node 281 of transistor 280 is coupled to third supply node 205 and to a first node of decoupling capacitor 267. The second terminals of decoupling capacitors (265, 266, and 267) are coupled to ground.

Node 273 of transistor 270 is coupled to a first node of inductor 294 and to a second node of resistor 225. In addition, node 278 of transistor 275, and node 283 of transistor 280 are coupled to the first node of inductor 294 and to the second node of resistor 225.

Second node of inductor 294 is coupled to a first node of capacitor 289 and to output node 202. The second node of capacitor 289 is coupled to ground.

In a preferred embodiment, second node of resistor 227 is coupled to input node 222 of operational amplifier 220 and to a first node of resistor 228. Input node 221 of operational amplifier 220 is coupled to ground. Output node 223 of operational amplifier 220 is coupled to input 236 of comparator 235, is coupled to input 241 of comparator 240, and is coupled to second node of resistor 228. Those skilled in the art will understand how to properly bias operational amplifier 220.

Output 238 of comparator 235 coupled to node 288 of transistor 285 and to node 292 of transistor 290. Output 239 of comparator 235 is not connected. Output 243 of comparator 240 is coupled to node 293 of transistor 290. Output 244 of comparator 240 is coupled to node 298 of transistor 295. Those skilled in the art will understand how to properly bias comparators (235 and 240).

First node of resistor 229 is coupled to fourth supply node 207. Input node 237 of comparator 235 is coupled to second node of resistor 229 and first node of resistor 230. Input node 242 of comparator 240 is coupled to second node of resistor 230 and first node of resistor 231. Second node of resistor 231 is coupled to ground.

Fifth supply node 208 is coupled to node 287 of transistor 285 and node 297 of transistor 295. In one embodiment, fourth supply node 207 and fifth supply node 208 are both coupled to a negative bias voltage during operation. For example, the negative bias voltage can be approximately minus three volts (−3V). In other embodiments, fourth supply node 207 and fifth supply node 208 do not have to be connected together.

In a preferred embodiment, first operational amplifier circuit 215 comprises operational amplifier 210, resistor 225, and resistor 226, and first operational amplifier circuit 215 is configured as an inverting amplifier. Desirably, operational amplifier 210 is a wideband device having an operating bandwidth greater than 10 MHz. In an alternate embodiment, a non-inverting amplifier configuration can be used. Those skilled in the art will recognize that by using different resistance values for resistors (225 and 226) different gains can be established.

Three-state selection circuit 209 comprises comparator 235, comparator 240, resistor 229, resistor 230, and resistor 231. Resistors (229, 230, and 231) form a resistive ladder network. The resistive ladder network establishes a first reference voltage at input 242 of comparator 240 and a second reference voltage at input 237 of comparator 235.

In a preferred embodiment, second operational amplifier circuit 225 comprises operational amplifier 220, resistor 227, and resistor 228, and second operational amplifier circuit 225 is configured as an inverting amplifier. Desirably, operational amplifier 220 is a wideband device having an operating bandwidth greater than 10 MHz. In an alternate embodiment, a non-inverting amplifier configuration can be used. Those skilled in the art will recognize that by using different resistance values for resistors (227 and 228) different gains can be established.

Operational amplifier 220 serves as a buffer amplifier and provides an inverted envelope signal 233 to two comparators (235 and 240) of a three-state selection circuit. Three-state selection circuit 209 is used to provide selection signals to switch driver circuit 219. Switch driver circuit 219 comprises transistors (285, 290, and 295).

When the amplitude of inverted envelope signal 233 is less than the first reference voltage, Three-state selection circuit 209 operates in a first state. In the first state, transistor 295 is turned-on and transistors (285 and 290) are turned-off. When the amplitude of inverted envelop signal 233 is greater than the first reference voltage but less than the second reference voltage, three-state selection circuit 209 operates in a second state. In the second state, transistor 290 is turned-on and transistors (285 and 295) are turned-off. When the amplitude of inverted envelope signal 233 is greater than the second reference voltage, three-state selection circuit 209 operates in a third state. In the third state, transistor 285 is turned-on and transistors (290 and 295) are turned-off.

In a preferred embodiment, drive signal routing circuit 216 comprises transistors (250, 255, and 260), and switch driver circuit 219 is coupled to drive signal routing circuit 216. When transistor 285 is turned-on in switch driver circuit 219, transistor 250 is turned-on in drive signal routing circuit 216. When transistor 290 is turned-on in switch driver circuit 219, transistor 255 is turned-on in drive signal routing circuit 216. When transistor 295 is turned-on in switch driver circuit 219, transistor 260 is turned-on in drive signal routing circuit 216.

In a preferred embodiment, power stage circuit 217 comprises transistors (270, 275, and 280), and drive signal routing circuit 216 is coupled to power stage circuit 217. When transistor 250 is turned-on in drive signal routing circuit 216, transistor 270 is turned-on in power stage circuit 217. When transistor 255 is turned-on in drive signal routing circuit 216, transistor 275 is turned-on in power stage circuit 217. When transistor 260 is turned-on in drive signal routing circuit 216, transistor 280 is turned-on in power stage circuit 217.

In a preferred embodiment, operational amplifier 210 serves as a buffer amplifier and amplifies envelope signal 232 to create drive signal 245. Drive signal 245 is provided to the input nodes of the three transistors in drive signal routing circuit 216. Desirably, operational amplifier 210 provides input nodes for the envelope signal and the feedback signal. Operational amplifier 210 operates as a difference amplifier and amplifies the difference between the envelope signal and the feedback signal to generate a drive signal for the output power stages. The drive signal is routed through one of the switches in the drive signal routing circuit to one of the stages in the power stage circuit. In the power stage circuit, one of the power stages is selected as a function of the input signal level. The selected output power stage (270, 275, or 280) establishes amplified envelope signal 246.

Amplified envelope signal 246 is filtered to produce envelope restoration signal 247, and envelope restoration signal 247 is provided at output node 202 of three-level class-G amplifier/modulator 200. In a preferred embodiment, the filtering provided by the lowpass filter, formed by inductor 294 and capacitor 289, is used to remove switching transients. Desirably, the lowpass filter does not affect the closed loop feedback stability.

In a preferred embodiment, output node 202 of three-level class-G amplifier/modulator 200 is coupled to the supply node of a power amplifier in an EER system as shown in FIG. 1. Desirably, envelope restoration signal 247 is used as the multi-level envelope restoration signal (134, FIG. 1).

In a preferred embodiment, transistors (250, 255, 260, 270, 275, 280, 285, 290, and 295) are depletion mode N channel GaAs field effect transistors (FETs). Depletion mode N channel GaAs FETs are preferred because these devices provide high switching speed, low ON resistance, and require low gate drive power. Typically, a gate to source voltage of zero volts (0 V.) turns the device "ON" and a gate to source voltage of minus three volts (−3 V.) turns the device "OFF". The gate input impedance is predominantly capacitance, requiring a gate drive power of $$P_g = C_{in} * (V_{gs}^2) * F_s.$$

The present invention operates at a unity bandwidth to switching frequency ratio, thereby providing a reduction in the gate drive power dissipation when compared to previous modulators having greater than unity ratios (e.g. ratios of 10–30).

In alternate embodiments, transistors (250, 255, 260, 270, 275, 280, 285, 290, and 295) can be many other types of solid state devices.

In alternate embodiments, higher power stages can be implemented by paralleling transistors in the power stage circuit. Parallel transistors provide lower ON resistance and allow operation at lower head voltages. Parallel transistors require more gate power but considerably more power is saved in the power stage circuit providing greater overall efficiency. Paralleling improves efficiency only up to a point, and an optimum choice is three devices for most designs.

The RF envelope bandwidth determines many of the design requirements for 3-level Class-G amplifier/modulator 200. For example, the following design requirements have been used for a multi-level class-G amplifier/modulator.

RF Envelope Bandwidth - - - 10 MHz min.

Input Voltage Range - - - $3V_{pp}$ max.

Output Voltage Range - - - 10 $V_{pp}$ max., 3 ohm load

Efficiency - - - 70–90%, 10 dB back off

Load - - - 3 Ohms in parallel with 500 pf.

A significant advantage provided by the method and apparatus of the present invention is integration. The majority of multi-stage class-G amplifier/modulator 200 can be implemented on a single, monolithic, semiconductor substrate such as complementary gallium arsenide (C-GaAs), CMOS, BiCMOS, or LDMOS. For example, in a preferred embodiment, drive signal routing circuit 216, switch driver circuit 219, and power stage circuit 217 are implemented on a single substrate. In another embodiment, operational amplifiers (210 and 220) and comparators (235 and 240) can also be included on a single substrate. This results in space savings, power savings, and much higher modulation bandwidths.

Figure 3:
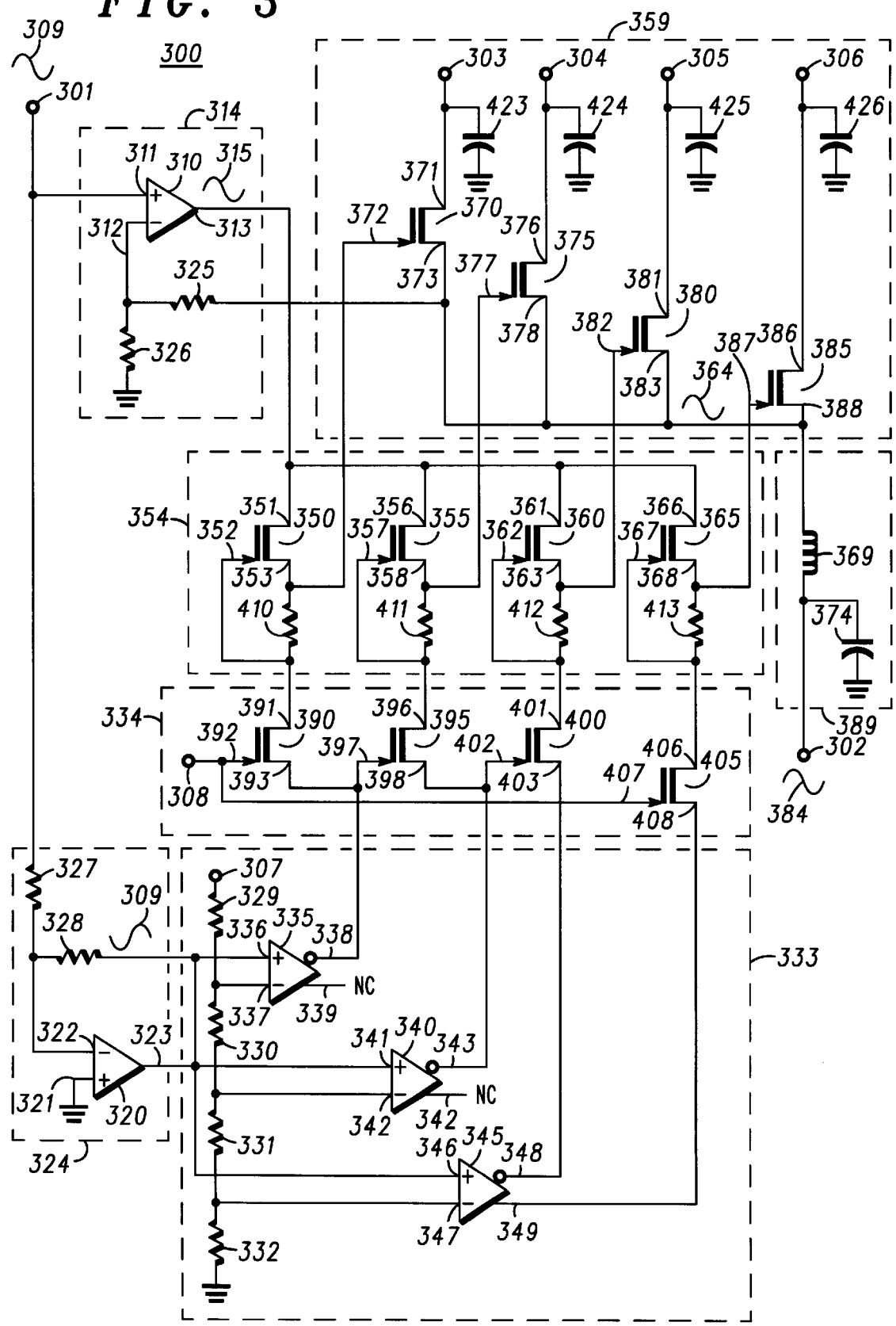
FIG. 3 illustrates a simplified schematic for a 4-level class-G amplifier/modulator in accordance with a preferred embodiment of the present invention.

FIG. 3 illustrates a simplified schematic for a four-level Class-G amplifier/modulator 300 in accordance with an alternate embodiment of the present invention. Four-level class-G amplifier/modulator 300 comprises input operational amplifiers circuits (314 and 324), four-state selection circuit 333, switch driver circuit 334, drive signal routing circuit 354, power stage circuit 359, and filter network 389.

Input node 301 is coupled to a first input 311 of operational amplifier 310 and to a first node of resistor 327. Second input 312 of operational amplifier 310 is coupled to a first node of resistor 325 and first node of resistor 326. Second node of resistor 326 is coupled to ground. Those skilled in the art will understand how to properly bias operational amplifier 310.

As illustrated in FIG. 3, output 313 of operational amplifier 310 is coupled to node 351 of transistor 350, coupled to node 356 of transistor 355, coupled to node 361 of transistor 360, and coupled to node 366 of transistor 365.

Node 352 of transistor 350 is coupled to node 391 of transistor 390 and to a second node of resistor 410. Node 357 of transistor 355 is coupled to node 396 of transistor 395 and to a second node of resistor 411. Node 362 of transistor 360 is coupled to node 401 of transistor 400 and to a second node of resistor 412. Node 367 of transistor 365 is coupled to node 406 of transistor 405 and to a second node of resistor 413.

Node 353 of transistor 350 is coupled to a first node of resistor 410 and to node 372 of transistor 370. Node 358 of transistor 355 is coupled to a first node of resistor 411 and to node 377 of transistor 375. Node 363 of transistor 360 is coupled to a first node of resistor 412 and to node 382 of transistor 380. Node 368 of transistor 365 is coupled to a first node of resistor 413 and to node 387 of transistor 385.

Node 371 of transistor 370 is coupled to first supply node 303 and to a first node of decoupling capacitor 423. Node 376 of transistor 375 is coupled to second supply node 304 and to a first node of decoupling capacitor 424. Node 381 of transistor 380 is coupled to third supply node 305 and to a first node of decoupling capacitor 425. Node 386 of transistor 385 is coupled to fourth supply node 306 and to a first node of decoupling capacitor 426. The second nodes of decoupling capacitors (423, 424, 425, and 426) are coupled to ground.

Node 373 of transistor 370 is coupled to a first node of inductor 369 and to a second node of resistor 325. In addition, node 378 of transistor 375, node 383 of transistor 380, and node 388 of transistor 385 are coupled to the first node of inductor 369 and to the second node of resistor 325.

Second node of inductor 369 is coupled to a first node of capacitor 374 and to output node 302. The second node of capacitor 374 is coupled to ground.

As illustrated in FIG. 3, second node of resistor 327 is coupled to input 322 of operational amplifier 320 and to a first node of resistor 328. Input 321 of operational amplifier 320 is coupled to ground. Output node 323 of operational amplifier 320 is coupled to input 336 of comparator 335, to input 341 of comparator 340, to input 346 of comparator 345, and to second node of resistor 328. Those skilled in the art will understand how to properly bias operational amplifier 320 and comparators (335, 340 and 345). Those skilled in the art will understand how to properly use the inputs and outputs of operational amplifier 320 and comparators (335, 340 and 345).

Output 338 of comparator 335 coupled to node 393 of transistor 390 and to node 397 of transistor 395. Output 339 of comparator 335 is not connected. Output 343 of comparator 340 coupled to node 398 of transistor 395 and to node 402 of transistor 400. Output 344 of comparator 340 is not connected. Output 348 of comparator 345 is coupled to node 403 of transistor 400, and output 349 of comparator 345 is coupled to node 408 of transistor 405.

First node of resistor 329 is coupled to fourth supply node 307. Input node 337 of comparator 335 is coupled to second node of resistor 329 and first node of resistor 330. Input node 342 of comparator 340 is coupled to second node of resistor 330 and first node of resistor 331. Input node 347 of comparator 345 is coupled to second node of resistor 331 and first node of resistor 332. Second node of resistor 332 is coupled to ground.

Sixth supply node 308 is coupled to node 392 of transistor 390 and node 407 of transistor 405. In one embodiment, fifth supply node 307 and sixth supply node 308 are both coupled to a negative bias voltage during operation. For example, the negative bias voltage can be approximately minus three volts (−3V). In other embodiments, fifth supply node 307 and sixth supply node 308 do not have to be connected together.

As shown in FIG. 3, first operational amplifier circuit 314 comprises operational amplifier 310, resistor 325, and resistor 326, and first operational amplifier circuit 314 is configured as a non-inverting amplifier. Desirably, operational amplifier 310 is a wideband device having an operating bandwidth greater than 10 MHz. In an alternate embodiment, an inverting amplifier configuration can be used. Those skilled in the art will recognize that by using different resistance values for resistors (225 and 226) different gains can be established.

Four-state selection circuit 333 comprises comparator 335, comparator 340, comparator 345, resistor 329, resistor 330, resistor 331, and resistor 332. Resistors (329, 330, 331, and 332) form a resistive ladder network. The resistive ladder network establishes a first reference voltage at input 347 of comparator 345, a second reference voltage at input 342 of comparator 340, and a third reference voltage at input 337 of comparator 335.

Operational amplifier 320 serves as a buffer amplifier and provides an inverted envelope signal 309 to three comparators (335, 340, and 345) of a four-state selection circuit. Four-state selection circuit 333 is used to provide signals to switch driver circuit 334. Switch driver circuit 334 comprises transistors (390, 395, 400, and 405).

When the amplitude of inverted envelop signal 309 is less than the first reference voltage, four-state selection circuit 333 operates in a first state. In the first state, transistor 405 is on and transistors (390, 395, and 400) are off. When the amplitude of inverted envelop signal 309 is greater than the first reference voltage but less than the second reference voltage, four-state selection circuit 333 operates in a second state. In the second state, transistor 400 is on and transistors (390, 395, and 405) are off. When the amplitude of inverted envelop signal 309 is greater than the second reference voltage but less than the third reference voltage, four-state selection circuit 333 operates in a third state. In the third state, transistor 395 is on and transistors (390, 400, and 405) are off. When the amplitude of inverted envelope signal 309 is greater than the third reference voltage, four-state selection circuit 333 operates in a fourth state. In the fourth state, transistor 390 is on and transistors (395, 400, and 405) are off.

In FIG. 3, switch driver circuit 334 is coupled to drive signal routing circuit 354. Drive signal routing circuit 354 comprises transistors (350, 355, 360, and 365). When transistor 390 is turned-on in switch driver circuit 334, transistor 350 is turned-on in drive signal routing circuit 354. When transistor 395 is turned-on in switch driver circuit 334, transistor 355 is turned-on in drive signal routing circuit 354. When transistor 400 is turned-on in switch driver circuit 334, transistor 360 is turned-on in drive signal routing circuit 354. When transistor 405 is turned-on in switch driver circuit 334, transistor 365 is turned-on in drive signal routing circuit 354.

In addition, FIG. 3 shows that drive signal routing circuit 354 is coupled to power stage circuit 359. Power stage circuit 359 comprises transistors (370, 375, 380, and 385). When transistor 350 is turned-on in drive signal routing circuit 354, transistor 370 is turned-on in power stage circuit 359. When transistor 355 is turned-on in drive signal routing circuit 354, transistor 375 is turned-on in power stage circuit 359. When transistor 360 is turned-on in drive signal routing circuit 354, transistor 380 is turned-on in power stage circuit 359. When transistor 365 is turned-on in drive signal routing circuit 354, transistor 385 is turned-on in power stage circuit 359.

Operational amplifier 310 serves as a buffer amplifier and provides an amplified envelope signal 315 to transistors (370, 375, 380, and 385) in drive signal routing circuit 354. Operational amplifier 310 provides input nodes for the envelope signal and the feedback signal. Operational amplifier 310 operates as a difference amplifier and amplifies the difference between the envelope signal and the feedback signal to generate a drive signal for the output power stages. The drive signal is routed through one of the switches in drive signal routing circuit 354 where one of the power stages is selected as a function of the input signal level. The selected output power stage (370, 375, 380, or 385) establishes the output signal 364.

A filtered version 384 of the output signal is provided at output node 302 of the four-level class-G amplifier/modulator 300. In this embodiment, the filtering provided by lowpass filter 389, formed by inductor 369 and capacitor 374, is used to remove switching transients. Desirably, the lowpass filter does not affect the closed loop feedback stability.

In an alternate embodiment, output node 302 of the four-level class-G amplifier/modulator 300 can be coupled to the supply node of the EER system as shown in FIG. 1.

As shown in FIG. 3, transistors (350, 355, 360, 365, 370, 375, 380, 385, 390, 395, 400, and 405) are depletion mode N channel GaAs field effect transistors (FETs). Depletion mode N channel GaAs FETs are preferred because these devices provide high switching speed, low ON resistance, and require low gate drive power. Typically, a gate to source voltage of zero volts (0 V.) turns the device "ON" and a gate to source voltage of minus three volts (−3 V.) turns the device "OFF".

In other alternate embodiments, transistors (350, 355, 360, 365, 370, 375, 380, 385, 390, 395, 400, and 405) can be many other types of solid state devices.

Figure 4:
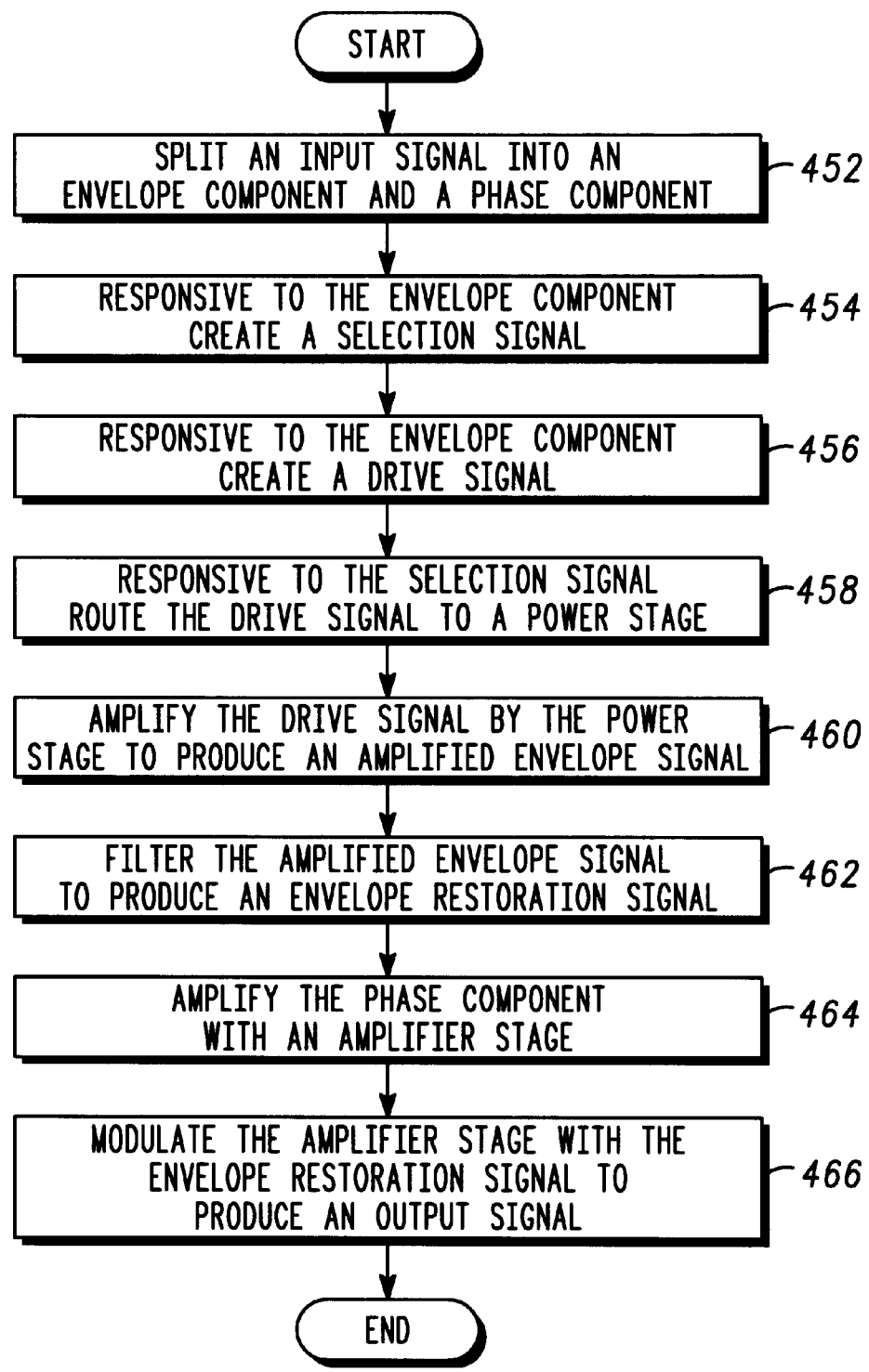
FIG. 4 shows a flowchart for a method of operating an EER-type amplifier that includes a class-G amplifier/modulator in accordance with a preferred embodiment of the present invention.

FIG. 4 shows a flowchart for a method of operating an EER-type amplifiers that includes a class-G amplifier/modulator in accordance with a preferred embodiment of the present invention. Method 450 starts with step 452 where an input signal is split into an envelope component and a phase signal component. The envelope signal is processed by the three-level class-G amplifier/modulator (200, FIG. 2) to produce an envelope restoration signal (134, FIG. 1). The envelope restoration signal has a duty cycle waveform substantially equal to the envelope component.

In step 454, a selection signal is created that is responsive to the envelope component. An inverted envelope signal 233 is produced when operational amplifier 220, operating as an inverting amplifier amplifies envelope signal 232. The three-state selection circuit establishes an operating state based on the amplitude of inverted envelope signal 233. The three-state selection circuit provides selection signals to the transistors in the switch driver circuit based on the operating state.

When the amplitude of inverted envelop signal 233 is less than the first reference voltage, the three-state selection circuit operates in a first state. In the first state, a first set of selection signals is created. The first set of selection signals is used to turn-on transistor 295 and turn-off transistors 285 and 290. When the amplitude of inverted envelop signal 233 is greater than the first reference voltage but less than the second reference voltage, the three-state selection circuit operates in a second state. In the second state, a second set of selection signals is created. The second set of selection signals is used to turn-on transistor 290 and turn-off transistors 285 and 295. When the amplitude of inverted envelope signal 233 is greater than the second reference voltage, the three-state selection circuit operates in the third state. In the third state, a third set of selection signals is created. The third set of selection signals is used to turn-on transistor 295 and turn-off transistors 285 and 290.

In step 456, a drive signal is created that is responsive to the envelope component. In a preferred embodiment, operational amplifier 210 serves as a buffer amplifier and amplifies envelope signal 232 to create drive signal 245.

In step 458, the drive signal is routed to one of a plurality of power stages based on the set of selection signals. In a preferred embodiment, a switch driver circuit provides at least one routing signal to the drive signal routing circuit. When transistor 285 is turned-on in the switch driver circuit, a routing signal is provided to the drive signal routing circuit, and transistor 250 is turned-on. When transistor 290 is turned-on in the switch driver circuit, a routing signal is provided to the drive signal routing circuit, and transistor 255 is turned-on. When transistor 295 is turned-on in the switch driver circuit, a routing signal is provided to the drive signal routing circuit, and transistor 260 is turned-on.

In step 460, the drive signal is amplified by the power stage circuit, and an amplified envelope signal is produced. When transistor 250 is turned-on in the drive signal routing circuit, transistor 270 is turned-on in the power stage circuit, thereby providing at least a portion of amplified envelope signal 246. When transistor 255 is turned-on in the drive signal routing circuit, transistor 275 is turned-on in the power stage circuit, thereby providing at least a portion of amplified envelope signal 246. When transistor 260 is turned-on in the drive signal routing circuit, transistor 280 is turned-on in the power stage circuit, thereby providing at least a portion of amplified envelope signal 246.

In step 462, the amplified envelope signal is filtered to produce an envelope restoration signal. Amplified envelope restoration signal 247 is provided at output node 202 of three-level class-G amplifier/modulator 200. In a preferred embodiment, the filtering provided by the lowpass filter, formed by inductor 294 and capacitor 289, is used to remove switching transients.

In step 464, the phase component is amplified by an amplifier stage. In a preferred embodiment, the amplifier stage is a power amplifier in an EER-type amplifier system.

In step 466, the amplifier stage is modulated by the envelope restoration signal 134 (FIG. 1) to produce RF output signal 136 (FIG. 1). In a preferred embodiment, output node of three-level class-G amplifier/modulator 200 (FIG. 2) is coupled to the supply node of a power amplifier in an EER-type amplifier as shown in FIG. 1.

It is desirable to recombine the amplitude of the signal with the phase of the signal after each has undergone a similar delay. Depending on the circuit elements used in amplifying the envelope signal and in amplifying the phase component, a time delay may be necessary in one or more signal paths in order to time align the recombination of the amplitude and phase.

In an alternate embodiment, the splitting means or the RF power amplifier 130 (FIG.1) can comprise a time delay element, which produces a delay substantially equal to that introduced by class-G amplifier/modulator 120 (FIG. 1) in the amplitude path. A time delay element can be used in the phase path because it is desirable to recombine the signals from the amplitude path and the phase path after each has been subjected to substantially equal delays. The absolute delay of time delay element is such that the total delay in the phase path is substantially equal to the total delay in the amplitude path. The actual placement of time delay element within the phase path is not a limitation of the present invention. Because the function of time delay element is to balance the delays in the phase path and the amplitude path, the actual position of time delay element in the phase path is not important.

Additional alternate embodiments of the present invention substantially match the delay in the two paths using circuit arrangements that comprise more than one time delay element. For example, one or more delay lines can be used in the phase path and/or the amplitude path. In this case, the absolute delay of any one delay line assumes less importance, and the differential delay between the two delay lines is used to match the delays in the two paths.

In summary, the method and apparatus of the present invention as described is a versatile way of achieving efficient amplification of a signal with a large RF bandwidth and a correspondingly large modulation bandwidth. Embodiments of an EER-type amplifier that utilizes a multi-level class G amplifier/modulator have been described. The multi-level class G amplifier/modulator efficiently amplifies a wideband envelope and allows the EER-type amplifier to efficiently amplify a wideband RF signal having a correspondingly wideband modulation bandwidth.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments. For example, multi-level class G amplifier/modulator could comprise more or less stages.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. An apparatus comprising:
   an envelope detector coupled to an input of said apparatus;
   a multi-level class-G amplifier/modulator coupled to a first output of said envelope detector,
   a radio frequency (RF) amplifier coupled to a second output of said envelope detector, coupled to an output of said apparatus, and coupled to said multilevel class-G amplifier/modulator; and
   wherein said multi-level class amplifier/modulator comprises:
      an operational amplifier circuit coupled to said first output of said envelope detector;
      a three-state selection circuit coupled to a first output of said operational amplifier circuit;
      a drive signal routing circuit coupled to a second output of said operational amplifier circuit;
      a switch driver circuit coupled to said three-state selection circuit and to said drive signal routing circuit; and
      a power stage circuit coupled to said drive signal routing circuit and to said RF amplifier.

2. The apparatus as claimed in claim 1, wherein said three-state selection circuit comprises:
   a resistive ladder network wherein a first reference voltage and a second reference voltage is established; and
   a comparator means coupled to said resistive ladder network, coupled to said second output of said operational amplifier circuit, and to said drive signal routing circuit.

3. The apparatus as claimed in claim 1, wherein said drive signal routing circuit comprises at least three switching transistors.

4. The apparatus as claimed in claim 3, wherein said switching transistors are field effect transistors (FETs).

5. The apparatus as claimed in claim 1, wherein said switch driver circuit comprises at least three switching transistors.

6. The apparatus as claimed in claim 5, wherein said switching transistors are field effect transistors (FETs).

7. The apparatus as claimed in claim 1, wherein said power stage circuit comprises at least three power transistors.

8. The apparatus as claimed in claim 7, wherein said power transistors are field effect transistors (FETs).

9. The apparatus as claimed in claim 1, wherein said apparatus is implemented on a monolithic semiconductor substrate.

10. An apparatus comprising:
    a multi-level selection means coupled to an input of the apparatus, said input comprising a signal path, said input for receiving a wide-bandwidth modulation signal and an output for providing at least one selection signal;
    a signal routing means coupled to said input and to said multi-level selection means; and
    a power stage circuit coupled to said signal routing means and to an output of said apparatus, said power stage circuit comprising a plurality of power stages.

11. The apparatus as claimed in claim 10, wherein said plurality of power stages are coupled between a plurality of supply voltages and an output of the apparatus such that when a power stage is turned-on, said output of the apparatus is electrically coupled to one of a plurality of supply voltages.

12. The apparatus as claimed in claim 11, wherein said signal routing means comprises:
    a first operational amplifier circuit coupled to the input of said apparatus, said first operational amplifier circuit for receiving said wide-bandwidth modulation signal and for providing an amplified signal; and
    a drive signal routing means responsively coupled to an output of said first operational amplifier circuit and to an input of one of said plurality of power stages, said drive signal routing means comprising a plurality of drive signal routing stages, wherein each drive signal routing stage is coupled to one of said plurality of power stages, such that when a signal routing stage is turned-on, an input of a corresponding power stage is electrically coupled to said output of said first operational amplifier circuit.

13. The apparatus as claimed in claim 12, wherein said multi-level selection means comprises:
    a second operational amplifier circuit coupled to the input of said apparatus, said second operational amplifier circuit for receiving said wide-bandwidth modulation signal and for providing an amplified signal;
    a selection means responsively coupled to an output of said second operational amplifier circuit, said selection means comprising a plurality of selection stages, such that when an amplified signal from the second operational amplifier circuit is equal to or greater than a first reference point one of said plurality of selection stages is in a first state; and
    a switch driver means responsively coupled to said selection means and to said drive signal routing means, said switch driver means comprising a plurality of switch driver stages, wherein each selection stage is coupled to one of said plurality of switch driver stages, such that when said one of the plurality of selection stages is in said first state, one of said plurality of switch driver stages is turned-on, thereby causing to one of said plurality of switch driver stages drive signal stage to be turned-on.

14. A method of amplifying an input signal, said method comprising the steps of:
    providing a selection signal from a selection circuit, said selection signal being responsive to an input signal;
    activating one of a plurality of transistors in a switch driver circuit responsive to said selection signal;
    activating one of a plurality of transistors in a drive signal routing circuit responsive said switch driver circuit; and
    activating one of a plurality of output power stages in a power stage circuit responsive to said drive signal circuit.

15. The method of amplifying an input signal as claimed in claim 14, further comprising the steps of:
    generating an amplified envelope signal from said one of said plurality of output power stages; and
    filtering said amplified envelope signal.

* * * * *